United States Patent [19]
Meltzer

[11] Patent Number: 5,544,173
[45] Date of Patent: *Aug. 6, 1996

[54] DELAY TEST COVERAGE WITHOUT ADDITIONAL DUMMY LATCHES IN A SCAN-BASED TEST DESIGN

[75] Inventor: David Meltzer, Wappingers Falls, N.Y.

[73] Assignee: International Business Machines Corporation, Armonk, N.Y.

[ * ] Notice: The term of this patent shall not extend beyond the expiration date of Pat. No. 5,502,731.

[21] Appl. No.: 486,112

[22] Filed: Jun. 7, 1995

Related U.S. Application Data

[62] Division of Ser. No. 292,375, Aug. 18, 1994.

[51] Int. Cl.$^6$ ..................................................... G06F 11/00
[52] U.S. Cl. .......................... 371/22.3; 371/22.5; 371/27
[58] Field of Search ................................. 371/22.3, 22.1, 371/22.5, 27

[56] References Cited

U.S. PATENT DOCUMENTS 5,023,875  6/1991  Lee et al. ................................ 371/25.1
5,187,712  2/1993  Malleo-Roach et al. .............. 371/22.1

OTHER PUBLICATIONS

Waicukauski et al., "Latch Model Reduction Using Latch Behaviorals", *IBM Technical Disclosure Bulletin*, vol. 31, No. 9, Feb. 1989, pp. 471–473.

Hanna, "SRL Arrangement to Minimize Latches in LSSD Design", *IBM Technical Disclosure Bulletin*, vol. 26, No. 2, Jul. 1983, pp. 567–568.

Hanna, "LSSD Design Techniques", *IBM Technical Disclosure Bulletin*, vol. 27, No. 12, May 1985, pp. 7120–7123.

*Primary Examiner*—Vincent P. Canney
*Attorney, Agent, or Firm*—Lynn L. Augspurger; Peter Visserman

[57] ABSTRACT

Scan testing of complex electronic logic circuits for the detection of AC delay faults is improved without the addition of dummy or test-only latches by connecting the shift register latches according to the order determined by the method of first listing all shift register latches in the scan chain with all the combinational circuit outputs traceable from the output; sorting this list in the order of number of outputs controlled, i.e., touched in the forward trace; listing each unique combinational circuit output; sequentially assigning the order of the SRLs in the scan chain so that adjacent SRLs do not control any of the same circuit outputs; when this is not possible assign adjacent SRLs so that the fewest common circuit outputs are controlled by adjacent SRLs or if any remain unassigned, insert an output SRL between adjacent SRLs. The additional consideration of physical distance between SRLs may be added as an ordering criterion.

3 Claims, 4 Drawing Sheets

DELAY TEST COVERAGE WITHOUT ADDITIONAL DUMMY LATCHES IN A SCAN-BASED TEST DESIGN

This is a division of application Ser. No. 08/292,375 filed Aug. 18, 1994.

FIELD OF THE INVENTION

This invention is related to the design of complex logic circuits which are to be tested with random patterns according to a scan test methodology such as the level sensitive scan methodology. More particularly to the method to design such test means on said chips by distributing the outputs of the shift register scan string to logic circuit inputs such that the random pattern testing may reveal delay faults and achieve the largest test coverage without the addition of extra latches which have no purpose other than the improve the test coverage.

BACKGROUND OF THE INVENTION

The present invention is generally directed to the testing of large complex logic circuits by scan test methodologies wherein test patterns or vectors are shifted into shift register latches which are components of functional registers in the logic circuit. Said patterns are usually generated by random test vector generators but my invention is not limited to such means of test pattern generation. More particularly, the present invention is directed to the testing of said large complex circuits to detect AC or delay faults by shifting into a particular shift register latch a pattern of a logic "0" followed by a logic "1" or vice versa in such a manner as to cause a transition of the observable output of a logic circuit under test. Even more particularly the invention is directed to a method of determining the optimal connection of the stages of the shift register to achieve the highest test coverage possible without the addition of extra shift-register latches which have no function other than to improve the test coverage.

Digital integrated circuits are conventionally tested by successively applying test vectors to the inputs of the circuits. Unless means are provided to apply these test vectors using logic already in the circuit, all the inputs to the logic circuit must be connected to primary inputs and all the outputs must be observable through primary outputs. Scan test methodologies, such as Level Sensitive Scan Design (LSSD), use the flip-flops in registers within the logic chip to present the test vectors to the combinational logic under test. Means must be provided to allow the flip-flops to shift data in and out when in so called scan mode, usually by daisy-chaining the flip-flops into a shift register latch scan chain. Means may be provided on chip to generate the test vectors and to compact the results of the test for comparison with the correct results to be expected from a good circuit.

It is well know to those skilled in the art that this scan technique may be extended to the testing for AC delay faults, i.e., those circuit faults wherein the circuits behave correctly according to the static logical equations expected but do not assume these values in the correct time but take longer then expected to assume the correct value. Using scan techniques to detect AC delay faults requires a time sequence of first and second test vectors. Said first test vector sensitizes the logic path to be tested. Said second test vector provides the appropriate plurality of logical "0" to "1" and "1" to "0" transitions from the first test vector to cause an observable logical output to switch. This is captured into a shift-register latch with an appropriate clock. If the correct value is captured, it is seen that the sensitized path switched with no more delay time then the time between the presentation of the second test vector and the capture clock.

The goal of such test means is to achieve the maximum fault coverage possible at a given acceptable cost. The three elements of cost are test vector design, test run time on the hardware under test, and additional hardware which must be added to a functional design to implement the test means. There is always an engineering compromise in selecting values for each of these cost elements, however since the additional hardware which must be added to the functional design is present in each manufactured circuit it is the highest cost item in general.

U.S. Pat. No. 5,278,842 issued Jan. 11, 1994 to R. W. Berry Jr. and J. Savir and assigned to the International Business Machines Corporation, attempts to maximize fault coverage with the addition of additional test only latches. They teach the method of selectively associating latch outputs in a level sensitive scan design latch string with logic circuit inputs such that latch outputs from latches which are adjacent on the scan chain do not feed the same cone of logic. The method taught therein maximizes the delay fault coverage by adding dummy latch elements when necessary between adjacent latches in the string. Said dummy latch elements are for test purposes only and do not feed any logic circuit input signal lines. As mentioned above, for cost reasons it is a priori undesirable to add such test only hardware. My invention teaches how to maximize the delay fault test coverage without the addition of such dummy latches. In addition, we would note that there are patents of which we are aware which are listed below with a brief discussion of each of the patents.

U.S. Pat. No. 5,023,875, issued Jun. 11, 1991 to G. W. Lee and G. D Underwood and assigned to Hughes Aircraft Company, shows a system for detecting scan faults, including delay faults, by connecting first and second serial data shift register stages to a logic circuit under test such that said first and second stages are always separated by a third serial data shift register stage. Said third serial data shift register stage is always a dummy stage in the meaning of the prior cited U.S. Pat. No. 5,278,842, i.e., it does not have any connection between its output and any input of the logic circuit under test. This system therefore has a high ratio of added test only latches to functional latches and is an inefficient means of increasing the delay fault coverage. However, it guarantees that all paths can be sensitized.

U.S. Pat. No. 5,187,712, issued Feb. 16, 1993 to J. A. Malleo-Roach et al. and assigned to AT&T Bell Laboratories teaches a method of partitioning a logic circuit containing groups of combinational elements fed by registers into sub-cones of logic of predetermined input width by the addition of a plurality of test point multiplexors. Said subcones of logic are then pseudo-exhaustively tested with a set of test vectors generated with a test vector generator. With this method it is usually impossible to assign separate vectors of the set of test vectors to each input of each subcone so that no subcone has two or more of its inputs supplied with the same vector. This prevents the test patterns from sensitizing all AC delay paths. However, this patent is not concerned with AC delay fault detection but only static combinational faults. The coverage lost by the overlapping of the subcone inputs is gained back by the generation of an additional set of vectors made of a linear combinations of the previously generated test vectors. This technique does not yield increased AC delay coverage.

Prior art: Publications

B. I. Dervisoglu and G. E. Strong "Design for Testability: Using Scanpath Techniques for Path-Delay Test and Measurement" in Proceedings of 1991 IEEE International Test Conference, P365 et seq., teach a method of implementing the scheme of U.S. Pat. No. 5,023,875 cited above using a so-called double strobe flip flop. This scheme is actually two parallel scan chains, independently loaded such that each input of each logic cone is fed from stage n of the first of said two chains and the input of the flip flop of stage n of the said first chain is fed from stage n of said second scan chain. This guarantees that the test vector sequence necessary to sensitize all potential delay fault paths can be generated. The amount of hardware in the scan chain is doubled and the wiring to connect the scan chains is also doubled. This is a large cost to get the necessary test coverage.

SUMMARY OF THE INVENTION

In accordance with my invention we have disclosed a method for achieving the maximum delay fault coverage in a scan test based digital circuit composed of combinational logic elements fed from register latches by connecting the latches of the scan chain in an optimal manner.

Accordingly it is an object of the present invention to improve AC or delay test coverage of said combinational logic circuits without the addition of special test only logic by an optimal ordering of shift register latches within the scan chain.

It is also an object of the current invention of using output only latches as a preferential means to improve said test coverage.

It is yet another object of the current invention to recognize that the interconnection of the scan chain should minimize the total length of the wires needed to interconnect the scan chain, thereby reducing the wiring load on the integrated circuit.

BRIEF DESCRIPTION OF THE DRAWINGS

Our detailed description explains the preferred embodiments of my invention, together with advantages and features, by way of example with reference to the following drawings.

DETAILED DESCRIPTION OF THE INVENTION

Figure 1:
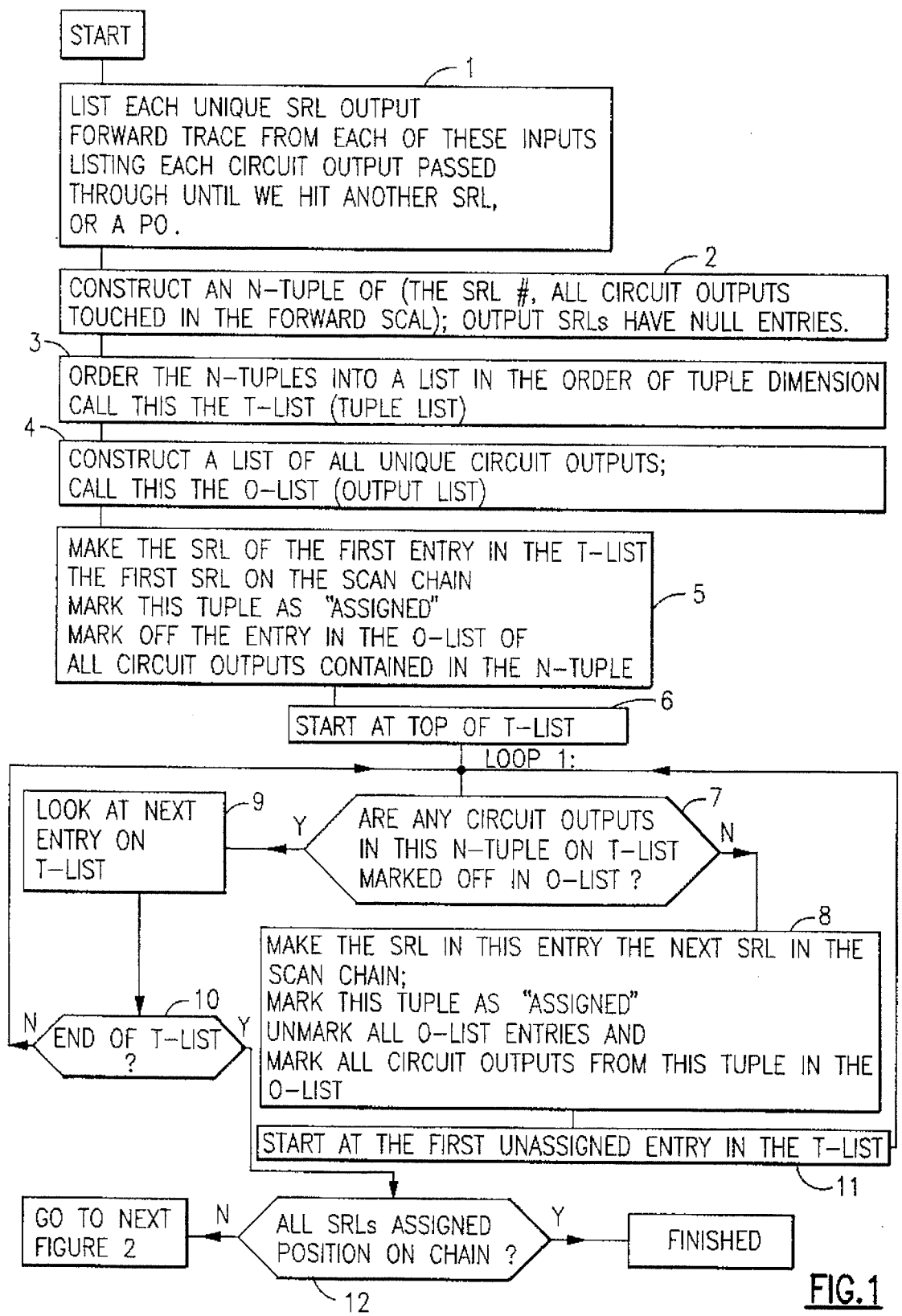
FIG. 1 shows the first pad of the method disclosed in the form of a flow chart.
Figure 2:
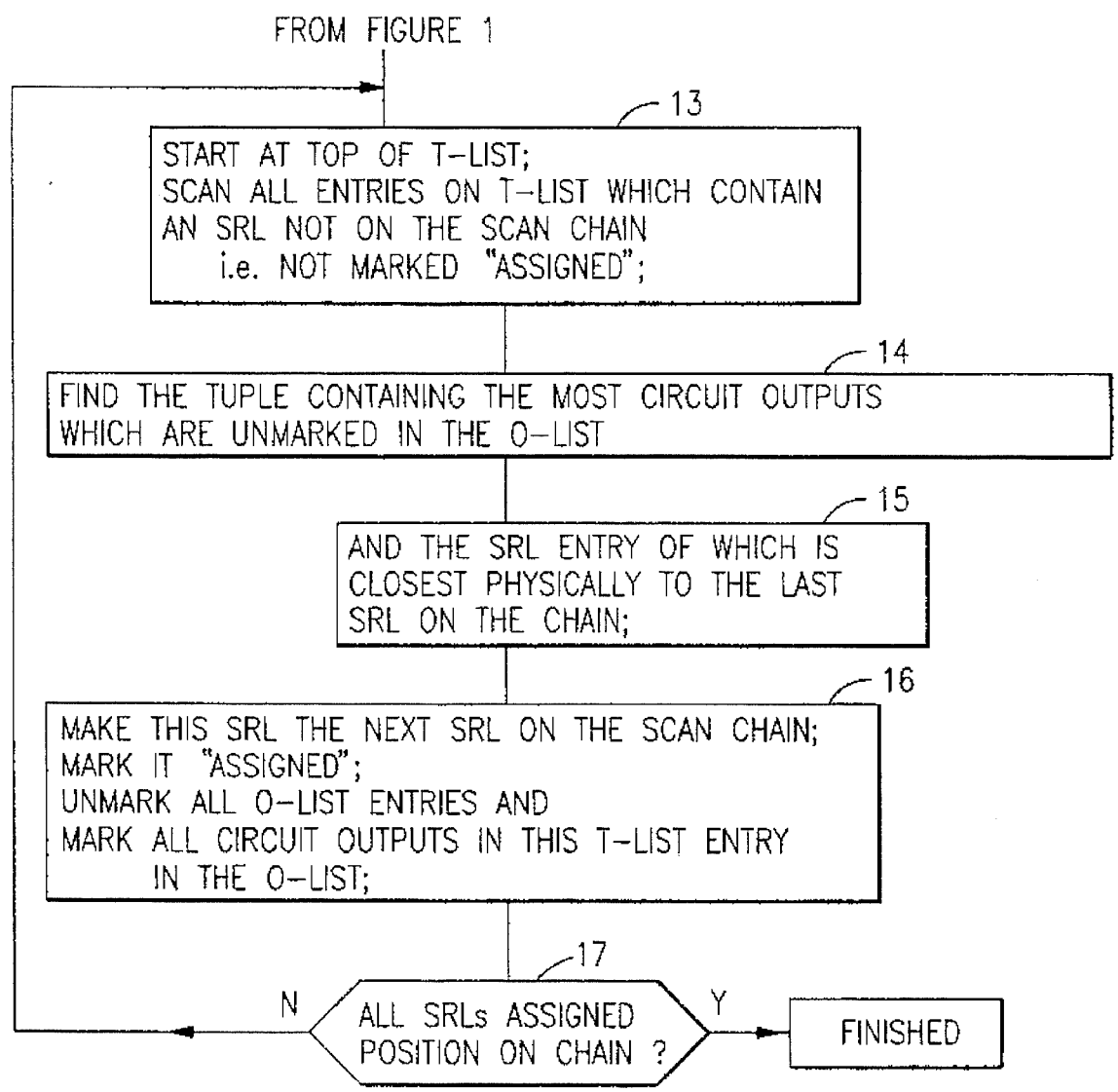
FIG. 2 shows the remainder of the method disclosed in the form of a flow chart.

In accordance with most logic circuit design methodologies, and more especially in the design of complex logic circuits to be tested with scan based tests, such as the LSSD methodology, registers are defined based on functional needs and a test analysis and design process is used to interconnect the shift register latches into scan chains and generate the test vectors and expected results. This latter process is the concern of the disclosed invention. Turning now to my invention in greater detail, FIGS. 1 and 2 illustrate my preferred embodiment of the basic invention as expressed as a flow-chart of the process. This method is applied to a logic circuit after the functional connections have been designed to connect the scan chain. The prior art methods to design these connections add dummy latches or other test only hardware to the scan chain means. Our preferred solution to this problem is to maximize the test coverage for delay faults without the addition of test only hardware.

FIG. 1 shows the first part of the disclosed method starting with a logic circuit with all non-test connections made. Each step in the process will be referred to by the appropriate number as shown in the figure. Step 1 analyzes the functional logic by associating the controlled outputs of each stage of the logic circuit to be tested with the Shift Register Latch (SRL) which controls an input to the stage. Each SRL of the plurality of SRLs in the logic circuit is first enumerated and given a unique identification number or letter. Similarly, a unique identification number or letter is given for each combinational circuit output. The forward trace of the logic stops at the input to another SRL (since it will not be affected by the logic test vector applied) or at a primary output which will not affect other down stream logic. The third element which may be on a complex logic chip is an array. Array inputs and outputs are generally connected directly to SRLs and so no special provision needs to be made in the method for arrays. Latches which feed array inputs may be considered output latches in the context of this invention.

Once the circuit to be tested has been analyzed, the result is stored in a table of n-tuples composed of the SRL number and all circuit outputs touched in the forward scan. Output SRLs are uniquely identified. Step 2 generates this n-tuple.

The next step, Step 3 sorts the n-tuples in the order of tuple dimension (i.e., number of terms in the tuple). This in effect means ordering the SRLs such that the latch which controls the most circuit outputs directly or indirectly is first on the list, and so on in order. This list is called the T-list (tuple list). Step 4 constructs a list of all unique circuit outputs which is called the O-List (Output-List). This list will be used to keep track of which outputs have SRLs which control them assigned positions on the chain.

At this point the actual assignment process can begin. The first SRL listed in the T-list is made the first SRL on the scan chain by step 5 and a mark is made to remember that it has been assigned a position on the chain. The outputs controlled by this SRL are marked of in the O-list, i.e., a mark is made to remember that a controlling SRL has been assigned a position on the chain.

A scan of all unassigned entries in the T-list from top to bottom is now done, initializing the starting point at the top of the T-List in step 6. The circuit outputs of each N-tuple on the T-List are examined in order looking for an unassigned SRL with no outputs marked off in the O-list. This scan is done by the combination of steps 7,9,10 until either the end of the T-list is encountered or a SRL meeting the criteria of Step 7 is found. Step 7 is a step in a determination loop which determines whether any combinational circuit outputs in an n-tuple on the T-List started by Step 6 marked off in the O-List. The determination is by a comparison answered "Y" (yes) or "N" (No). If the determination in Step 7 was "N" then Step 8 makes an assignment by making the SRL in this entry the next SRL in the Scan chane; it marks this tupple as "assigned"; it unmarks all O-List entries: and it marks all circuit outputs from this tyjple in the O-List. The output of Step 8 is the input to Step 11 where the loop is continued starting at the first unassigned entry in the T-List. However, if the answer is "Y", the Step 9 looks at the next entry on the T-List. The output of Step 9. is the input to the comparator step of Step 10 which check for the end of the T-List and provides an input back though the loop beginning at Step 7 if it is not at the end of the list, but if the T-List is at the end, the end signal is a input to the determination step of Step 12. Thus assignment is initiated by the criteria of Step 7. When an SRL meeting these criteria is found step 8 assigns it a position on the chain and makes the appropriate marks. The scan is resumed at step 11 at the first unassigned entry in the T-list. If the scan is completed and all SRLs have been assigned, as determined by step 12 then the process is completed. However if all SRLs have not been assigned the method is continued on the flow chart shown in FIG. 2.

The remaining steps of the method disclosed assign the remaining unassigned SRLs in the order of the number of circuits and the additional criterion of minimum wiring for the interconnection. The T-list is scanned from the top looking for unassigned SRLs in step 13 and all the SRLs found are examined in steps 14, 15 to find that one which meets the criteria. Step 16 does the housekeeping to assign the SRL the next position on the chain and mark the appropriate lists. The scan is resumed by step 17 until all the remaining SRLs are assigned.

The wiring length criteria applied in step 15 in FIG. 2 may also be applied when choosing among SRLs which control the same number of outputs in the steps shown in FIG. 1.

Figure 3:
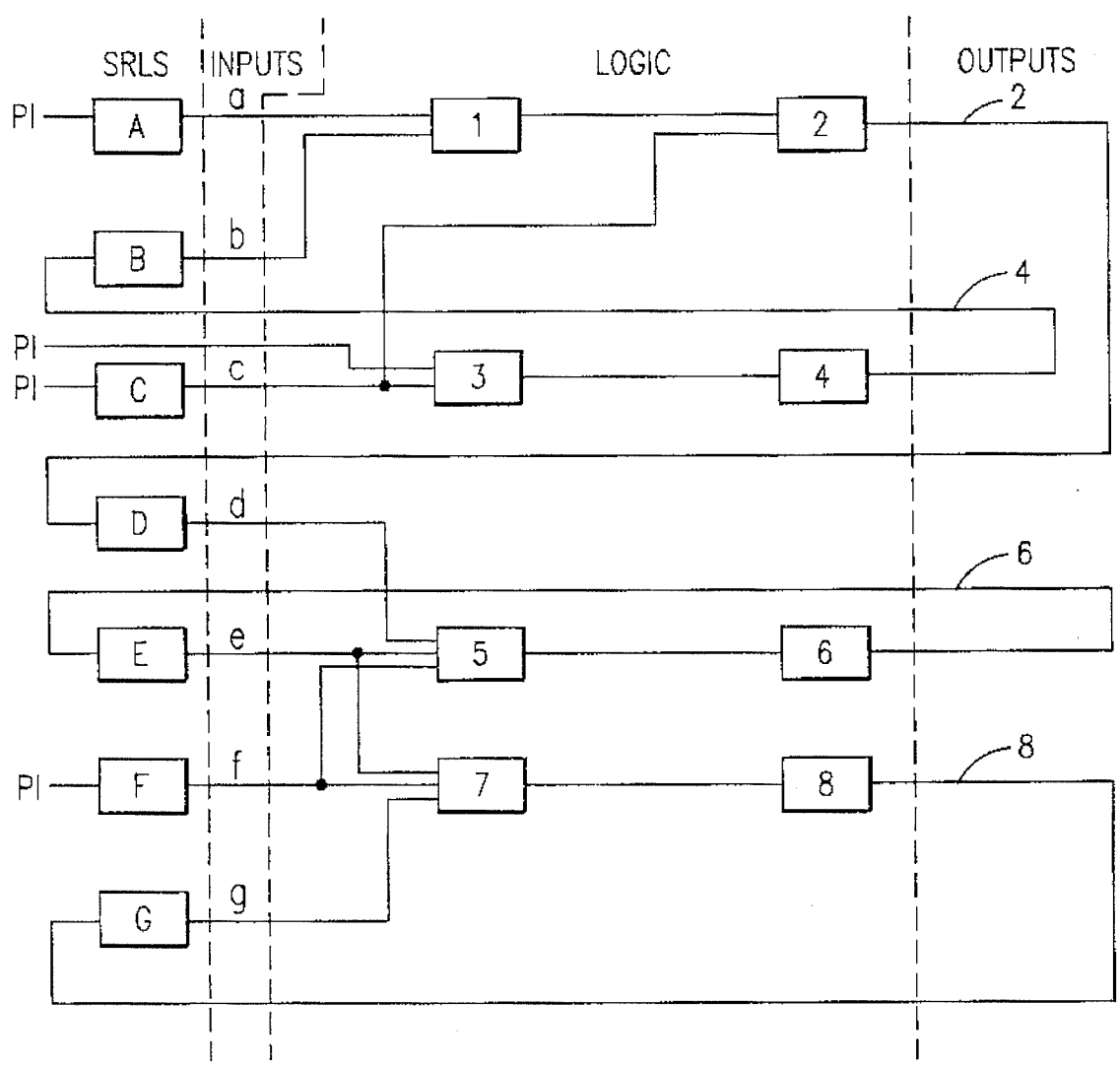
FIG. 3 shows an exemplary logic circuit with no interconnection of the scan chain to which this invention will be applied to explain the disclosed method. All logic circuits are shown with inputs on the left and outputs on the right.

Having disclosed the method to be used in designing the scan test means, consideration is now directed to FIG. 3 in which a logic circuit with seven SRLs connected to the inputs to eight logic circuit elements. Said logic circuit elements may be individual AND, OR, NOR, NAND, or INVERT gates or may in fact represent more complicated combinational and/or sequential circuits. The circuit is shown with the SRL outputs connected only to the functional logic and no connections of the scan chain are illustrated. This circuit is shown for the purpose of providing an example of the assignment method. The figure shows each SRL, SRL output, circuit and circuit output labelled with a unique number or letter identifier. The following table shows the method applied to the circuit of FIG. 3. (Note in FIG. 3, the logic circuit outputs assigned value numbers 1,2,3,4,5,6,7 and 8, based upon inputs a,b,c,d,e,f,g; while after scan ordering the Figure shows the O-List with orders circled.)

TABLE 1

| INPUTS | CIRCUIT OUTPUTS | T-LIST | SCAN ORDER | O-LIST |
|---|---|---|---|---|
| a | 1,2 | e5,6,7,8 | E | 2 |
| b | 1,2 | f5,6,7,8 | C | 4 |
| c | 2,3,4 | c2,3,4 | F | 6 |
| d | 5,8 | a1,2 | A | 8 |
| e | 5,6,7,8 | b1,2 | D | |
| f | 5,6,7,8 | d5,6 | B | |
| g | 7,8 | g7,8 | G | |

The column labelled "SCAN ORDER" represents the interconnection wiring order of the circuit of FIG. 3 to achieve the AC fault test coverage of the invention. The SRL labelled E is the first on the scan chain followed by C, then F, then A etc. in sequential order.

Figure 4:
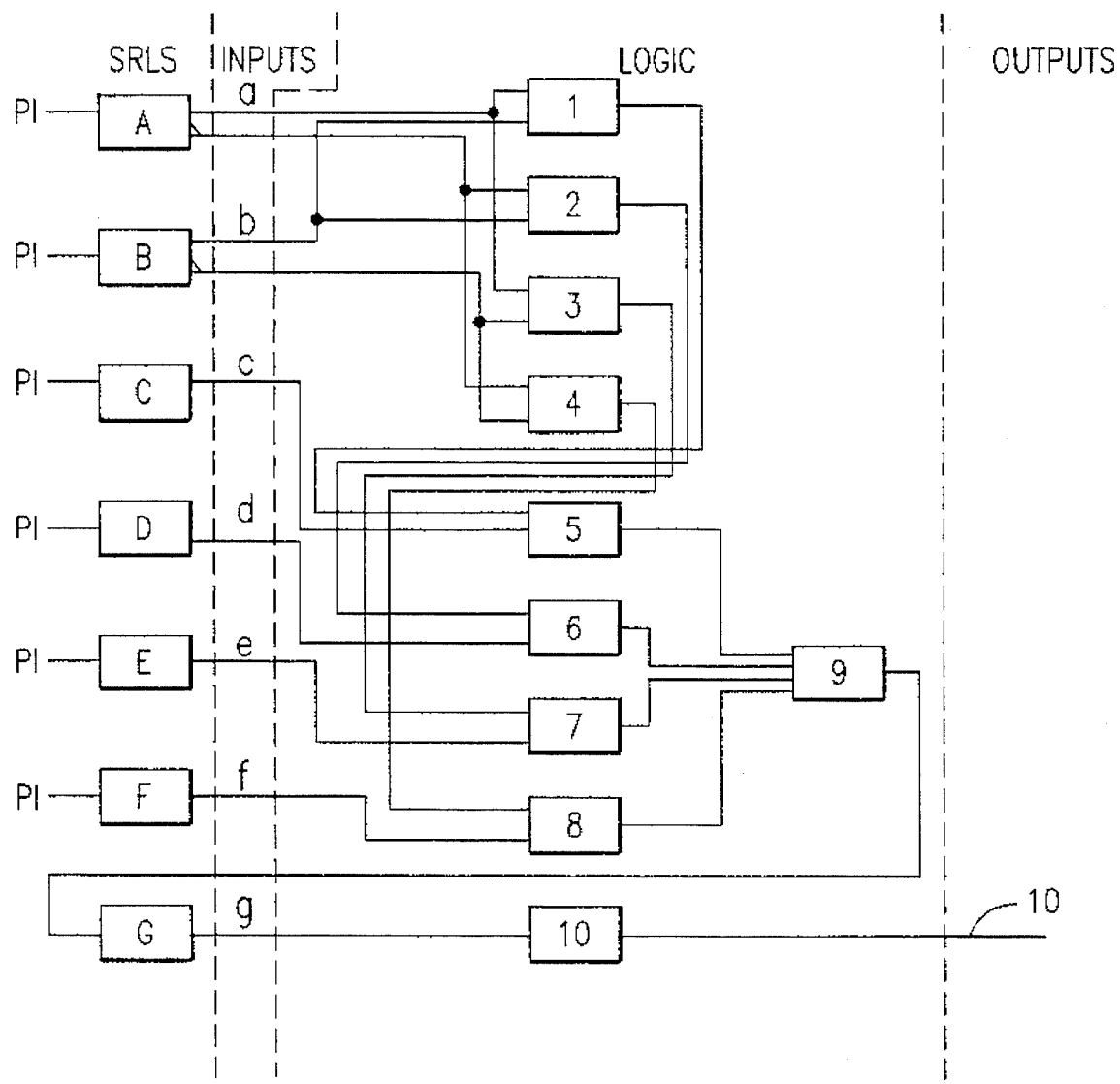
FIG. 4 shows a decoder logic circuit which is the second example used to explain the disclosed method. All logic circuits are shown with inputs on the left and outputs on the right.

A second exemplary circuit is shown in FIG. 4. to show the use of output SRLs in the chain. The conventions used in this figure are the same as for FIG. 1. Note that circuit 10 with output order 10 is fed by output SRL G. % %

The following table shows the method applied to the circuit shown in FIG. 4. (Note in FIG. 4, the logic circuit outputs assigned value numbers 1,2,3,4,5,6,7,8 and 9, based upon inputs a,b,c,d,e,f,g; while after scan ordering the Figure shows the O-List with order 10 circled for logic circuit 10).

TABLE 2

| INPUTS | CIRCUIT OUTPUTS | SCAN ORDER |
|---|---|---|
| a | 1,2,3,4,5,6,7,8,9 | A |
| b | 1,2,3,4,5,6,7,8,9 | G |
| c | 5,9 | B |
| d | 6,9 | C |
| e | 7,9 | D |
| f | 8,9 | E |
| g | OUTPUT | F |

It can be seen that the order of the scan chain for SRLs c,d,e,f is arbitrary by the criterion of maximum circuit outputs controlled and only the use of the physical distance criterion provides a definitive ordering.

While I have described my preferred embodiments of my invention, it will be understood that those skilled in the aft, both now and in the future, may make various improvements and enhancements which fall within the scope of the claims which follow. These claims should be construed to maintain the proper protection for the invention first disclosed.

We claim:

1. A method of configuring a digital integrated logic circuit having a plurality of interconnected combinational circuits, each having at least one input and at least one output, and a plurality of daisy chained flip-flops arranged as a scan chain of shift register latches, each shift register latch having an output and a scan input, and wherein the output of each of the shift register latches is connected to either an input of one of the plurality interconnected combinational elements or to a primary output of said digital integrated circuit, and is connected to the scan chain input of another shift register latch by a method comprising the steps of:

determining the order of connection of said shift register latches in said scan chain to maximize the number of circuits tested for AC delay faults; and in the process assigning a scan chain order by:

a. creating a list of all shift register latches (SRLs) in the scan chain with all the combinational circuit outputs traceable from said primary output;

b. sorting said list in the order of number of circuit outputs controlled by being touched in a forward trace of said combinational circuits;

c. listing each unique combinational circuit output;

d. sequentially assigning the order of the SRLs in the scan chain so that adjacent SRLs do not control any of the same circuit outputs.

2. The method in accordance with claim 1 and further comprising the following steps: when successful assignment according to step d. is not possible, assigning adjacent SRLs so that the fewest common circuit outputs are controlled by adjacent SRLs or if any remain unassigned, then sequentially inserting an output shift register latch between adjacent SRLs.

3. The method of claim 1 wherein weighted preference is given to assigning adjacent SRLs to the scan chain which are physically closest to each other on the integrated circuit chip.

* * * * *